United States Patent [19]
Reichardt

[11] Patent Number: 6,105,868
[45] Date of Patent: Aug. 22, 2000

[54] CHIP CARD CONTACTING DEVICE

[75] Inventor: Manfred Reichardt, Weinsberg, Germany

[73] Assignee: Amphenol-Tuchel Electronics GmbH, Germany

[21] Appl. No.: 08/927,900

[22] Filed: Sep. 11, 1997

[30] Foreign Application Priority Data

Sep. 20, 1996 [DE] Germany .................. 196 38 622

[51] Int. Cl.[7] .................................................. G06K 7/015
[52] U.S. Cl. .................. 235/441; 235/485; 235/492
[58] Field of Search .................................. 235/441, 475, 235/483, 485, 492

[56] References Cited

U.S. PATENT DOCUMENTS

| | | | |
|---|---|---|---|
| 4,735,578 | 4/1988 | Reichardt et al. | 439/152 |
| 4,752,234 | 6/1988 | Reichardt et al. | 439/260 |
| 4,799,891 | 1/1989 | Reichardt et al. | 439/43 |
| 4,814,593 | 3/1989 | Reichardt et al. | 235/482 |
| 4,932,889 | 6/1990 | Bleier et al. | 439/260 |
| 4,975,086 | 12/1990 | Reichardt et al. | 439/629 |
| 4,976,630 | 12/1990 | Schuder et al. | 439/260 |
| 5,259,777 | 11/1993 | Schuder et al. | 439/188 |
| 5,269,707 | 12/1993 | Reichardt et al. | 439/630 |
| 5,320,552 | 6/1994 | Reichardt et al. | 439/331 |
| 5,334,034 | 8/1994 | Reichardt et al. | 439/188 |
| 5,334,827 | 8/1994 | Bleier et al. | 235/492 |
| 5,336,877 | 8/1994 | Raab et al. | 235/475 |
| 5,369,259 | 11/1994 | Bleier et al. | 235/441 |
| 5,370,544 | 12/1994 | Reichardt et al. | 439/188 |
| 5,550,361 | 8/1996 | Huis et al. | 235/440 |
| 5,586,890 | 12/1996 | Braun | 439/66 |
| 5,640,307 | 6/1997 | Bleier et al. | 361/740 |
| 5,718,609 | 2/1998 | Braun et al. | 439/630 |
| 5,726,432 | 3/1998 | Reichardt | 235/441 |
| 5,796,085 | 8/1998 | Bleier | 235/441 |
| 5,796,093 | 8/1998 | Reichardt et al. | 235/492 |
| 5,814,805 | 9/1998 | Dullin | 235/479 |
| 5,821,515 | 10/1998 | Kitahara | 235/441 |
| 5,837,984 | 11/1998 | Bleier et al. | 235/441 |
| 5,872,353 | 2/1999 | Reichardt et al. | 235/441 |

OTHER PUBLICATIONS

U.S. application No. 08/914,156, Reichardt et al., filed Aug. 19, 1997.

*Primary Examiner*—Donald Hajec
*Assistant Examiner*—Drew A. Dunn
*Attorney, Agent, or Firm*—Blank Rome Comisky & McCauley, LLP

[57] ABSTRACT

A chip-card reader includes a frame in which contact elements are provided. The contact elements serve to contact corresponding contacts on a chip-card. The chip-card is supported by a contact force take-up element that extends linearly across the card and engages the card on a side of the chip-card opposite the side on which the chip-card contacts are situated.

16 Claims, 5 Drawing Sheets

CHIP CARD CONTACTING DEVICE

FIELD OF THE INVENTION

The invention relates to a chip-card contacting device (chip-card reader) comprising a set of contact elements. The chip-card reader serves the purpose of bringing said contact elements into contact with chip-card contacts (located on said chip-card) so as to read out or also to read in information from or to the chip contained in the chip-card.

BACKGROUND OF THE INVENTION

Chip-card readers are built into various apparatuses or the like, for example telephone apparatuses, so as to make the use of e.g. the telephone apparatus dependent on the insertion of a suitable chip-card.

A large number of chip-card readers are already known and, in this context, reference is made to the German laid-open publication DE-OS 38 10 274. In a known design of a chip-card reader, a construction that the present invention particularly but not solely develops further, a stationary component (frame) is used, whereby a moveable part in the form of a so-called contact support (contact carrier) is reciprocally mounted in the stationary frame. Guide means are provided for the movement of the contact support that takes place between a starting position and a reading position. If a chip-card is inserted into such a card reader, a pushing force ("push") must be carried out on the chip-card in order to displace the contact support to its reading position. In the reading position, the contact support together with the chip-card, whose contacts now are contacted, are fixedly held through brake or holding means (brake), generally opposing the force of return spring means that strive to bring the contact support back into its starting position. When one desires to again remove the card after the reading operation, one must pull ("pull") on the end of the card generally still sticking out of the chip-card reader in order to thus free the card and the contact support from the brake. During this pulling out of the chip-card, the contact support also then moves back again to its starting position, generally under the influence of said return spring means. A chip-card reader of this design is also referred to as working according to the push-pull principle.

Other known chip-card readers, in particular also of the type of a push-pull chip-card reader, are known from DE 38 10 274.1. They are called "simple" readers in that no moveable contact support is used, but rather the contact elements are mounted on or injection molded directly into a frame. A lower or bottom portion forms a card seat, said lower portion being fixable on an upper portion, for instance the frame. Since the lower portion in itself is not necessary, it can, for example, be provided by the apparatus in which the chip-card reader is used, whereby the apparatus then provides the card seat.

The use of a card seat in the form of a lower portion of the chip-card reader or also in the form of a portion of an apparatus in which the chip-card reader is used has the disadvantage that foreign bodies, such as only a part of a chip-card (e.g. half of a chip-card), inserted (sometimes even intentionally) into the chip-card reader, block the entire reader. Such vandalism can make the apparatus in which the chip-card reader is used unusable.

SUMMARY OF THE INVENTION

It is an object of the invention to avoid this disadvantage. The invention provides for the role of the seat surface in accordance with the state of the art being taken over by a linear engagement (touching) of the chip-card. This linear engagement is preferably provided by at least one rod, a bolt, a bar or a shaft.

Such a shaft forms a linear seat for the chip-card, in particular the chip-card located in the reading position, and extends over the underside of the frame, namely with a separation that allows the passing through of the chip-card.

The shaft (rod) thus forms a contact force take-up support. Simultaneously, a free space for the passing through of parts or other foreign bodies is created by the linear engagement.

The shaft (rod) extends, in particular also in the case of a reader in accordance with DE 38 10 274.1, preferably over the range (area) of the underside of the frame where an opening for taking up (accepting) the moveable contact support is provided.

In accordance with a preferred embodiment, the shaft (rod) is fastened to the frame at both of its ends. In accordance with a further embodiment of the invention, the shaft (rod) is a round bolt. The round bolt or rod is preferably located (mounted) in the area of the reading contacts when these are located in the reading position (active position).

According to a preferred embodiment, an elastomer roller is rotatably mounted on the round bolt (rod, shaft).

In accordance with a further preferred embodiment of the invention, the round rod or bar is rotatably mounted at both of its ends in bearing portions that themselves are preferably fastened to the frame of the chip-chard reader.

A tube-shaped elastomer layer is preferably provided on the rod or bar, preferably formed thereupon. The elastomer layer is preferably provided solely in the middle of the bar or bolt or shaft in approximately an area of an opening in the frame. Preferably, the elastomer layer can also be formed in that one pushes an elastomer tube onto the rod or bar. The tube can either fit fixedly on the bar through its own elasticity or also be glued thereto.

BRIEF DESCRIPTION OF THE DRAWINGS

Further advantages, objects and details of the invention can be gathered from the description of the embodiments based on the drawings. The drawings show:

In FIG. 1, reference sign 3 schematically designates some type of apparatus, for example a telephone apparatus, into which a chip-card reader (chip-card contacting device) 1 in accordance with the invention can be built. A chip-card 2, after the building in of the chip-card reader 1 into the apparatus 3, serves to make the apparatus 3, for example, ready for operation in that a user inserts the chip-card 2 into the chip-card reader 1.

Prior art

Figure 1:
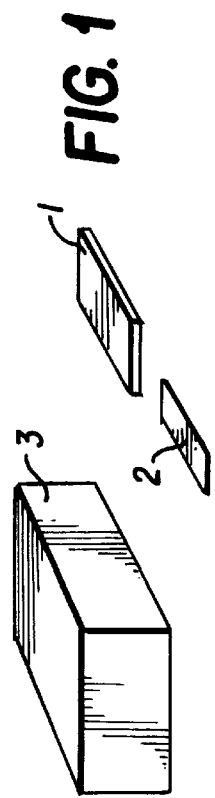
FIG. 1 a schematical view of a chip-card reader together with a chip-card and an apparatus, for example a telephone apparatus, into which the chip-card reader can be built.

In FIG. 2 to 7, a chip-card reader 1 known from DE 38 10 274 A1 is shown in detail.

With regard to the construction of the chip-card reader 1, reference is now made primarily to FIG. 2 to 7. In particular in FIG. 2 and 4, one can see that the chip-card reader 1 comprises a stationary component 5 that can also be designated as upper portion or frame. This frame can be designated as an upper portion since a lower portion 7 forming a card seat illustrated in FIG. 4 in cross-section is fixable to this frame, whereby, however, all functions of the chip-card reader 1 are implemented in the upper portion or frame 5 such that the lower portion 7 is not necessary in and of itself, but rather is provided, for example, by the apparatus 3 which then provides the card seat.

The frame 5 forms an opening 4 that is limited by two frame side portions 18, 19 as well as a frame back portion 20 and frame front portion 21.

Figure 2:
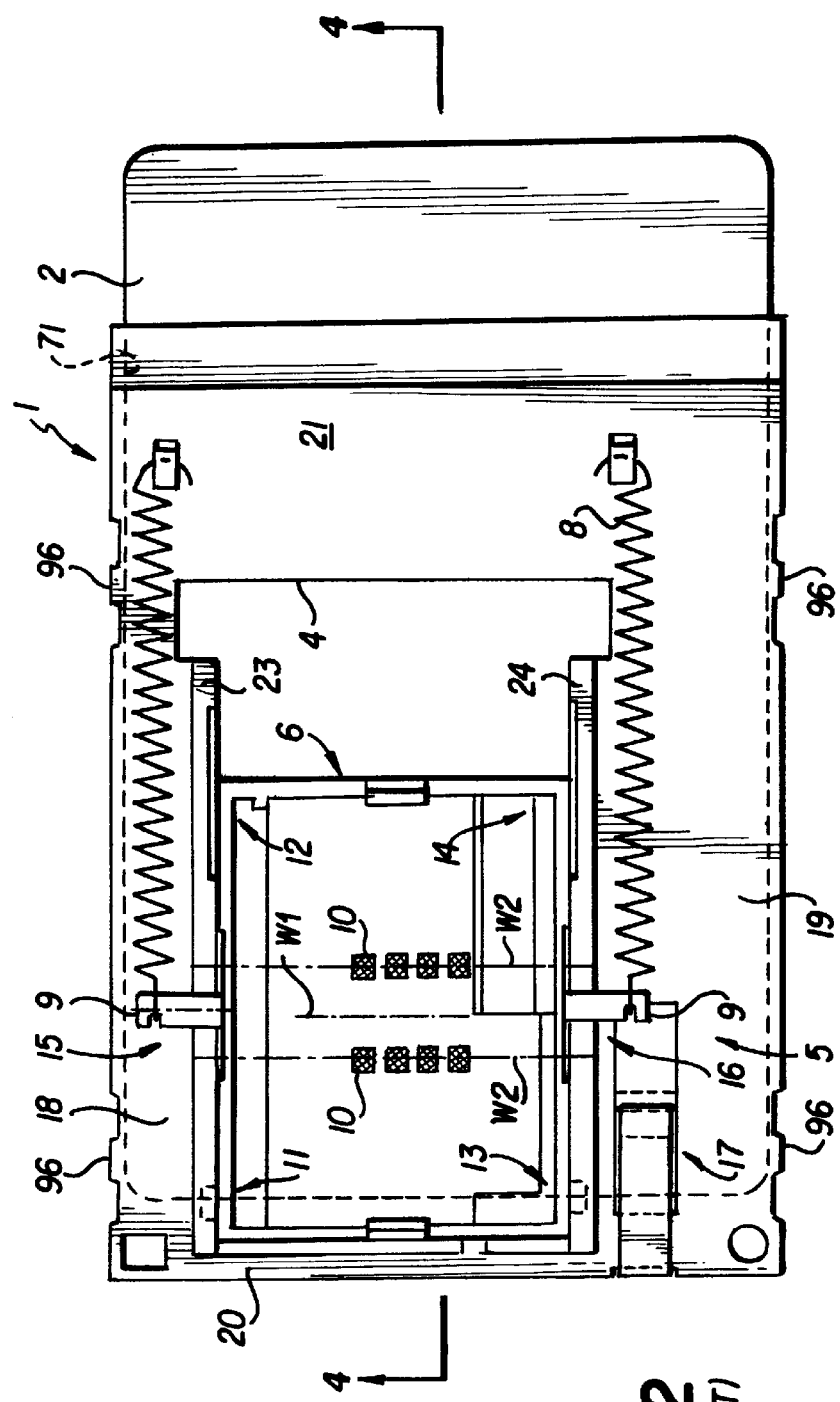
FIG. 2 a plan view of a chip-card reader in accordance with the prior art with a chip-card located in reading position.
Figure 3:
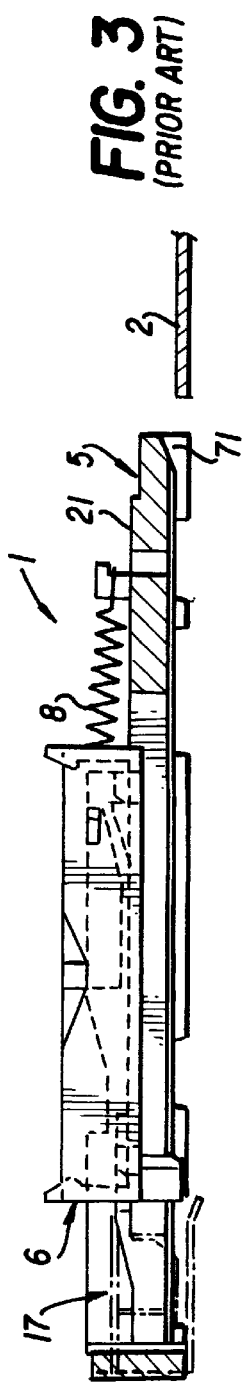
FIG. 3 a cross-section along line 4—4 in FIG. 2, whereby, however, in contrast to FIG. 2, the chip-card reader as well as the contact support moved by the chip-card are located in their starting position.
Figure 4:
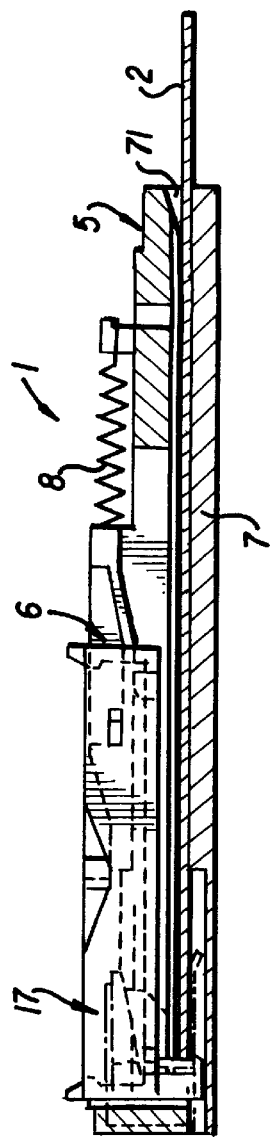
FIG. 4 a cross-section along line 4—4 in FIG. 2 with chip-card and corresponding contact support in reading position, whereby it is also illustrated that the chip-card reader can comprise an upper portion, the so-called frame, and a lower portion.

In the area of the opening 4, a contact support 6 carrying a set of contact elements not shown is reciprocally moveable between a starting position shown in FIG. 3 and a reading position shown in FIG. 2 and 4. Return means 8 in the form of two springs strive to hold the contact support 6 in its starting position.

In FIG. 2, one can see through to the chip-card contacts 10 present on the chip-card 2. This lies in the fact that, in the illustration of FIG. 2, the contact support 6 is itself formed frame-shaped but a component (set of contacts) carrying the contact elements of the contact support 6 is not yet inserted into the contact support 6.

Figure 5:
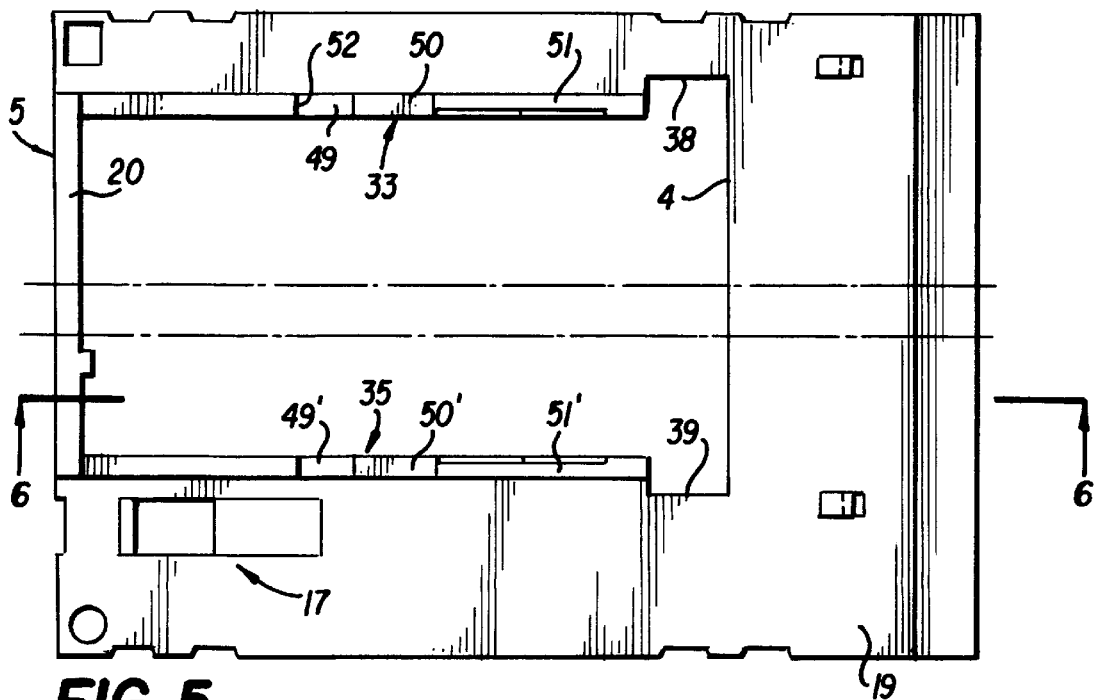
FIG. 5 a plan view onto the frame of the chip-card reader in accordance with FIG. 2, whereby the contact support is not inserted.
Figure 6:
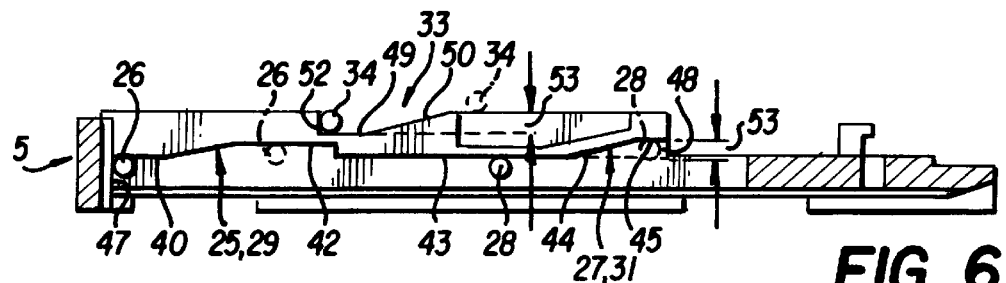
FIG. 6 a cross-section along line 6—6 in FIG. 5, whereby guide means for the contact support are also schematically illustrated.
Figure 7:
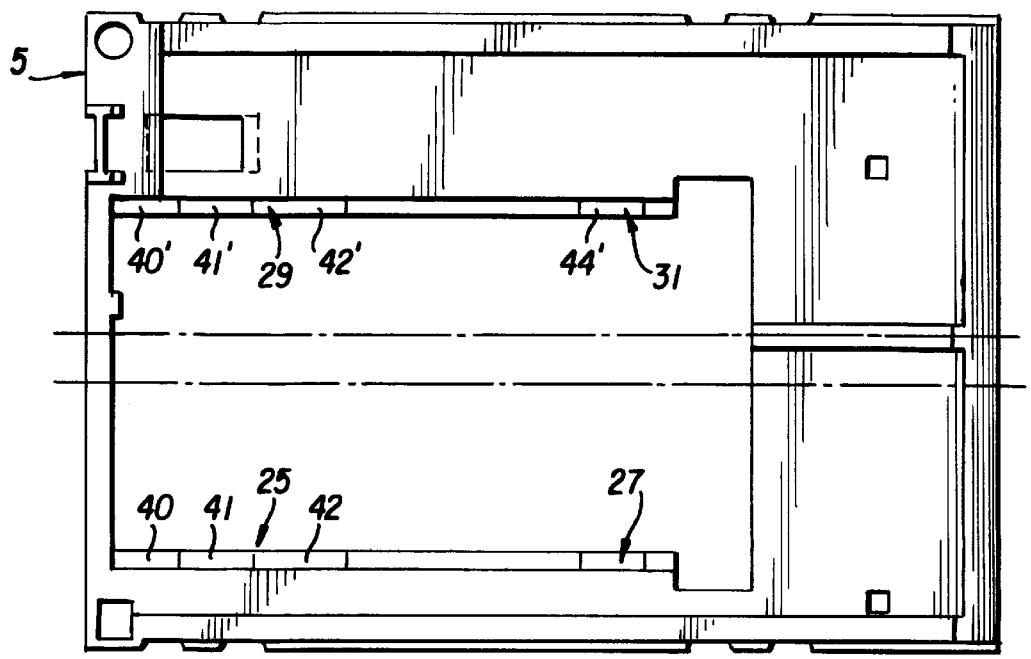
FIG. 7 a plan view from below of the frame shown in FIG. 5, i.e. of the underside of the frame.

The support and form-fitting guiding of the contact support 6 along the frame 5 is carried out by guide means, in particular via first through sixth guide means 11 to 16. The guide means allow a form-fitting lowering of the contact support 6 carrying the set of contact elements, during its movement from its starting position (FIG. 3) into its reading position (FIG. 4). The reading position is represented in FIG. 6 by three pegs 26, 28, 34 represented by dashed lines. The starting position is represented in FIG. 6 by three pegs 26, 28, 34 represented by solid lines In detail, the illustrated embodiment, compare FIG. 5, 6 and 7, provides the following:

The first guide means 11 consist of a first frame-side guide in the form of first guide track 25 and a first contact support-side guide in the form of a first guide peg 26. The second guide means 12 comprise second frame-side guide means in the form of a second guide track 27 as well as a second contact carrier-side guide in the form of a second peg 28. The third guide means 13 comprise a third frame-side guide in the form of a third guide track 29 as well as a third contact support-side guide in the form of a third peg. The fourth guide means comprise a fourth frame-side guide in the form of a fourth guide track 31 as well as a fourth contact support-side guide in the form of a fourth peg. The fifth guide means 15 comprise a fifth frame-side guide in the form of a fifth guide track 33 as well as a fifth contact support-side guide in the form of a fifth peg 34. The sixth guide means 16 finally comprise a sixth frame-side guide in the form of a sixth guide track in addition to a sixth contact support-side guide in the form of a sixth peg.

The frame-side guides are preferably formed on the longitudinal flanges 23 and 24 that project inwardly from the frame-side portions 18, 19. The flanges 23, 24 do not extend over the entire length of the opening 4 but rather form, as shown for example in FIG. 5, an assembly opening 38 and 39, respectively.

The first guide track 25 comprises a planar guide track 40 with a sloped guide track (lowering or press-against curve) 41 adjacent thereto and a further planar guide track 42 elevationally displaced (by the value 53 in FIG. 6) with respect to guide track 40. Similarly, the second guide track 27 also comprises a planar guide track 43 with a sloped guide track (lowering or pressing against curve) 44 adjacent thereto as well as a planar guide track 45 adjacent thereto, the latter of which again is elevationally displaced (by the value 53 in FIG. 6) with respect to guide track 43. Furthermore, stops 47 are formed for the guide pegs 26 and 28.

The fifth guide track 33 comprises a planar guide track 49, a sloped guide track 50 adjacent thereto and again a planar guide track 51 adjacent thereto elevationally displaced with respect to track 49. Furthermore, a stop 52 is formed for the fifth peg 34 when the contact support 6 is located in its reading position.

Due to the symmetrical construction, i.e. the first guide means 11 correspond to the third guide means 13, the second guide means 12 correspond to the fourth guide means 14, and the fifth guide means 15 correspond to the sixth guide means 16, when necessary, the identical reference signs for the details of guide means 13, 14 and 16 are used in the following as for the guide means 11, 12 and 15 provided, however, with a prime.

A contact support 6 and the set of contacts not shown can be manufactured from plastic (synthetic material) as a single piece. The frame 5 is also preferably of plastic and manufactured in particular through injection molding.

The illustrated chip-card reader works according to the so-called push-pull principle, i.e. after the insertion (push) of the card to up until the reading position, the card is held there by a brake 17 and can again be pulled out (pull) from this reading position after completion of the reading operation.

First Embodiment

FIG. 8 to 11 show a first embodiment of a frame 500 formed in accordance with the invention that can be used in a chip-card reader without forming a card seat through a lower portion or through an apparatus accepting the chip-card reader.

The frame 500 in accordance with the invention is formed practically identical to the frame 5 of the aforementioned prior art. In particular, FIG. 8 (that is a plan view of the frame underside 7 or 6) corresponds, excepting the card seat or contact force support 700 which may also be referred to as the contact force take-up element 700 that has been newly added and has yet to be described, to FIG. 7 that shows the underside of frame 5. Contrary to the prior art of FIG. 2 to 7, the frame 500 in accordance with the invention does also not require a brake means 17 shown only schematically in FIG. 8 since the contact force support 700 takes over the function of the brake. A contact support 6 not shown in FIG. 8 (but partially in FIG. 10) is mounted in frame 500, said contact support being identical to the contact support 6 of the aforementioned prior art. Were the contact support 6 to be inserted into frame 500 with its set of contact elements, its contact elements would be visible in FIG. 8 in a plan view. A detail of this contact support 6 is illustrated further below based on FIG. 10 and 11, in particular together with a preferred positioning of the contact force support (contact force support means; contact support apparatus) 700 in accordance with the invention.

The invention generally sets forth that the contact force support 700 in accordance with the invention is formed in a manner and is provided running across the frame underside 706 such that a continuous surface-like contact force support for the chip-card 2, be it through a lower portion or through the device itself, is avoided. In accordance with the invention, the contact force support 700 is formed such that a purely linear-shaped support for or engagement to the chip-card 6 is provided.

Preferably (compare FIG. 10 and 11), the contact force support 700 is mounted in the area of the reading contacts 601, 602 (active position) or in the space between the contact elements and the insertion opening 71. One should be reminded that the contact support 6 is displaced during insertion of the chip-card 2 indicated only partially in FIG. 13 from the position designated in FIG. 13 by "A" to the position designated by "B"(by lowering the contact support 6).

Figure 8:
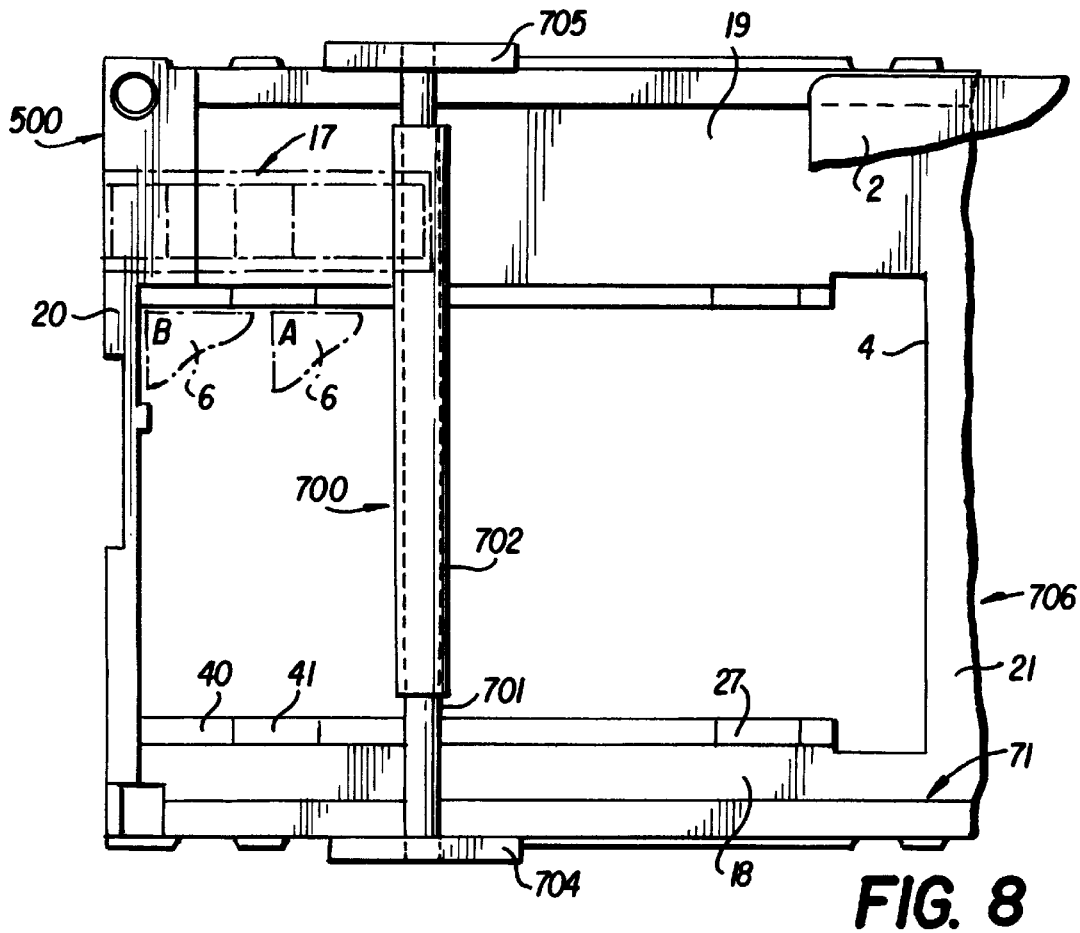
FIG. 8 a plan view onto the underside of the frame of a fist embodiment of a chip-card reader in accordance with the invention when the contact support is removed.
Figure 9:
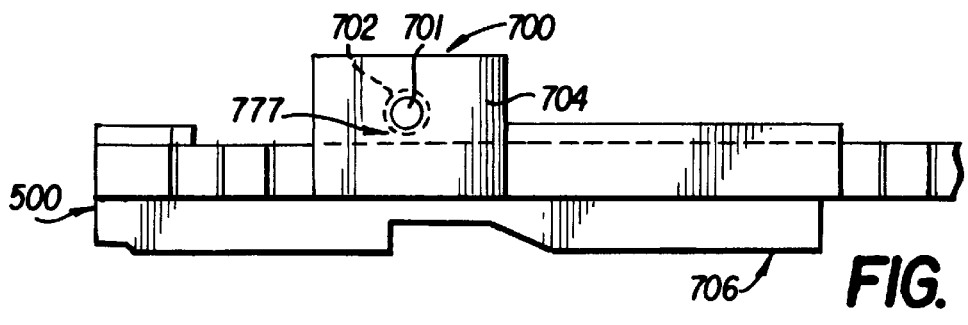
FIG. 9 a side elevational view of the frame of FIG. 8.

As the first embodiment of the invention in accordance with FIG. 8 and 9 shows, the contact force support 700 is formed by a rod or bar (also designated as shaft or bolt) 701. The shaft 701 is preferably round and is provided with an elastomer layer 702. The elastomer layer 702 can be formed onto the shaft 701. Alternatively , a tube consisting of elastomer material forming the layer 702 can be pushed onto the shaft 701. The tube can sit fixedly on the shaft 701 due to its own elasticity. As the case may be, the tube can be fixed, for example glued, onto the shaft 701.

The width of the elastomer layer 702 or the tube forming the layer can be chosen differently. Preferably, the elastomer layer 702 is provided in the area (range) of the width of the contact support 6. The elastomer layer 702 can, however, also extend over the entire width of the frame 500 or of a chip-card 2.

It is also conceivable to provide the round shaft serving for contact force support with an elastomer roller rotatably mounted thereon in place of the lower portion of the chip-card reader.

In the first embodiment of FIG. 8 and 9, the shaft 701 is fixed to frame 500, preferably rotatably mounted. Bearing plates 704, 705 with bores in which the shaft 701 can rotate, said bearing plates 704, 705 being mounted on the side portions 18, 19 of the frame 500, serve for mounting.

Preferably, the shaft 701 is provided, as shown, running transversely across the width of the frame 500. The shaft 701 forms, together with the layer 702, a gap 777 (FIG. 9) such that a chip-card 2 can be inserted between frame-part seat surface and layer 702. When the card 2 is inserted and the contact support 6 is located in the reading position (indicated by B in FIG. 8), the shaft 701 takes up the contact force and holds or fixedly clamps the card 2 such that, preferably, no additional card brake indicated by 17 is necessary.

Figure 11:
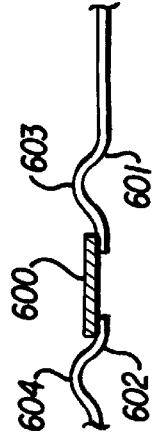
FIG. 11 a schematic cross-section along the line 16—16 of FIG. 10.
Figure 10:
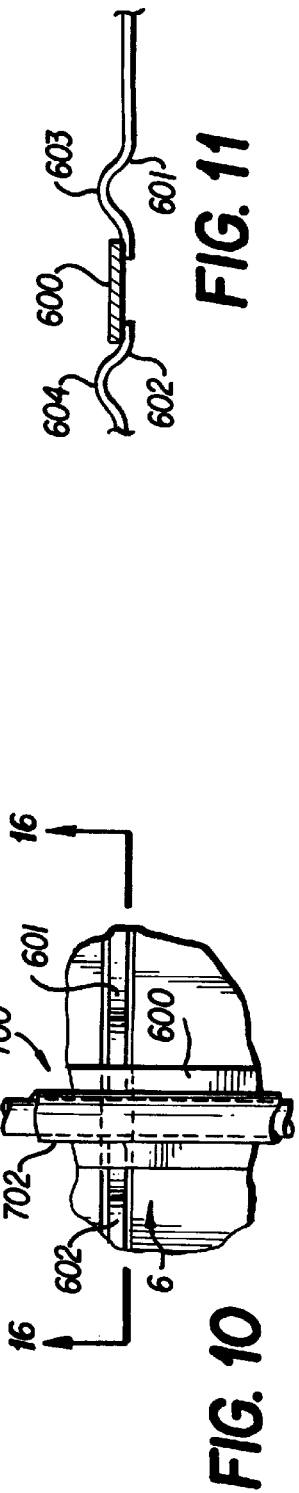
FIG. 10 a detail of the contact support shown in FIG. 8 but not in FIG. 2 for illustrating a preferred positioning of a rod or bar shown in FIG. 8.

The preferred positioning of the shaft (bolt) 701 shown in FIG. 8 and 9 is illustrated in FIG. 10 and 11.

FIG. 10 and 11 show a section of the contact support 6 that is also represented in FIG. 2, 3 and 4 in detail. In these named figures, however, the contact elements 601, 602 (that are also designated as reading contacts) shown in FIG. 10 and 11 are not shown. As is known, at least four such read-contact element pairs 601, 602 are located adjacent one another and mutually opposed in contact support 6. The inserted chip-card 2 can then produce, with its chip-card contacts 10 as shown in FIG. 2, contact with the reading contacts 601, 602. Typically, switching contacts are also provided in contact support 6.

Contact support 6 itself is typically manufactured of plastic, and the contact elements 601, 602 etc. are either injection molded into the plastic or inserted into chambers formed in the plastic of the contact support 6.

In a preferred embodiment of the contact support 6, a flange or crossbar 600 is formed by this contact support 6 (compare FIG. 10 and 11). The free ends of the contact elements 601, 602 etc. preferably biasedly contact (touch) said flange 600. Only one contact element pair 601, 602 is represented in FIG. 10; three further such pairs, for example, are also to be imagined however. During insertion of the chip-card into the gap 777 between the underside 706 of the frame 500 and the contact force support 700, the contact elements 601, 602 (in FIG. 11) preferably comprising cusps 603, 604 are pressed downwardly. In that one preferably locates the contact force support 700 (in particular the shaft 701) in the area of the crossbar 600, one achieves a favorable support of the contact force when the contact support 6 is in the reading position (active range designated in FIG. 8 by B).

Second Embodiment

Figure 12:
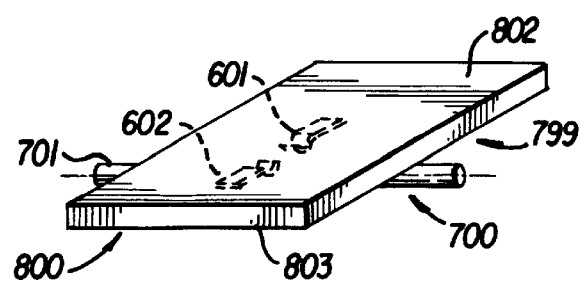
FIG. 12 a schematic view of a second embodiment of a chip-card reader in accordance with the invention, wherein, as opposed to FIG. 8, a perspective plan view onto the upper side of the frame is illustrated.
Figure 13:
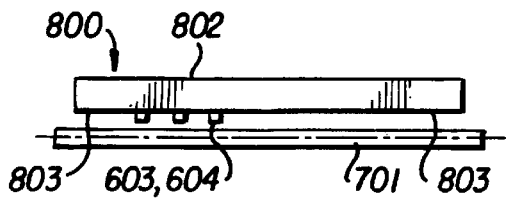
FIG. 13 a schematic front elevational view of the chip-card reader of FIG. 12.

The invention was described together with a chip-card reader that comprises a lowerable contact support comprising a set of contact elements 6. The invention can be used in an identical manner with a chip-card reader that does not use a lowerable contact support having a set of contact elements. Such a chip-card reader 799 is schematically illustrated in FIG. 12 and 13 as a second embodiment of the invention. The chip-card reader 799 possesses a (illustrated turned around in comparison to FIG. 8 and 9) plastic frame 800 with an upper side 802 and an underside 803. In the frame 801 preferably injection molded of plastic, schematically illustrated contact elements 601, 602 etc. are located that preferably project out (jut out) from the underside 803 of the frame 801 with their preferably present contact cusps 603, 604 as is illustrated in FIG. 13. Here too, no moveable contact support 6 is provided.

Figure 16:
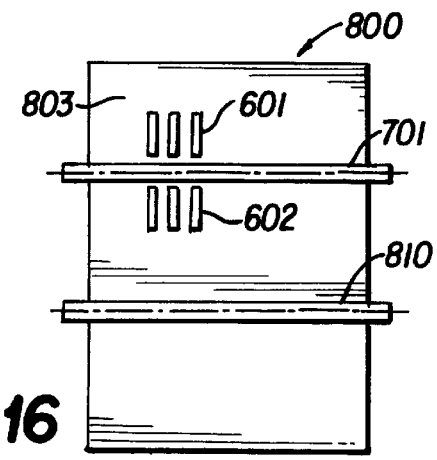
FIG. 16 a schematic plan view onto the underside of the frame of FIG. 12, whereby here also a possibility is additionally illustrated wherein not only one bar as in FIG. 12 but a further bar is provided.

The contact force support (contact force support means) 700 are also useful for such a chip-card reader 799 of the so-called simple design. In the embodiments of FIG. 12 and 13, a contact force support 700 is implemented by a bolt, bar or a shaft 701 that runs transversely across the frame 800 as shown in the upper portion of FIG. 16. Instead of only using one shaft 701, several, for example two, such shafts could also be used. The plan view of FIG. 16 onto the underside 803 of frame 800 shows the possibility of configuring more than only one shaft 701 running transversely across the underside 803. A further shaft 810 is illustrated in FIG. 16 spaced from shaft 701. The second embodiment of FIG. 12 and 13 leaves open the question as to whereon the contact force support 700 in the form of a shaft 700 is mounted—be it on frame 800, similar to what is shown for the first embodiment, or be it onto the apparatus 3, in which the chip-card reader is employed.

Third embodiment

Figure 14:
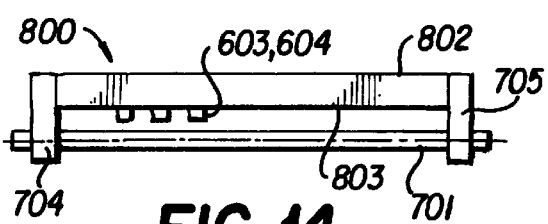
FIG. 14 a third embodiment of the invention similar to FIG. 13, whereby here the mounting (holder) of a bar to the frame is illustrated.

The third embodiment in accordance with FIG. 14 illustrates that the shaft 701, similar to the first embodiment of FIG. 8, is fastened to the frame 800 by support arms (brackets) 704, 705. The shaft 701 can be rotatably mounted in the support arms 704, 705, for example by friction bearings. The shaft 701 can, however, also be fixedly mounted to the support frame. The shaft 701 of the two embodiments can possess an arbitrary form; it is preferably circular in cross-section.

Further Embodiments

Figure 15:
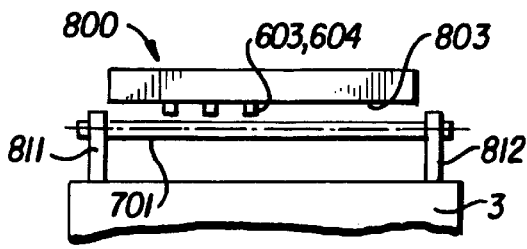
FIG. 15 a fourth embodiment of the invention similar to FIG. 13, whereby here the mounting of a bar to the apparatus is illustrated with which the chip-card reader is to be used.

The embodiment of FIG. 15 illustrates a different mounting of the contact force support or take-up element 700 i.e. the shaft 701. In this case, the shaft 701 is mounted on apparatus 3, for example a telephone apparatus via brackets 811, 812. Also in the embodiment of FIG. 15, instead of only one shaft 701, two or more can be provided as is schematically shown, for instance, in FIG. 16.

Figure 17:
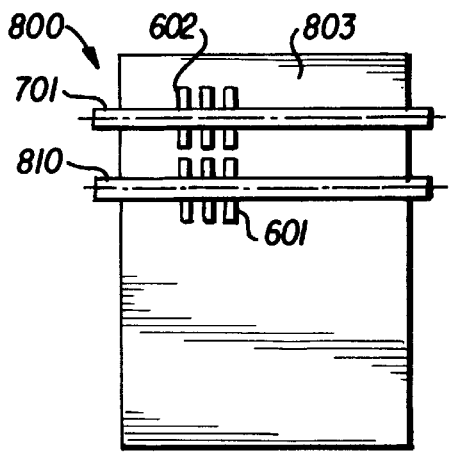
FIG. 17 a view similar to FIG. 16, whereby a different configuration of the two bars or shafts is illustrated.

FIG. 17 shows a position for the shafts 701 and 810 alternative to FIG. 16. The shafts 701 and 810 lie substantially in the area of the contact elements 601, 602, namely in particular in the range of the contact cusps of these contact elements 601, 602. The preferred position by use of a single shaft 701 is indicated in FIG. 2 through the dashed line designated by W1. The line W2 in FIG. 2 shows the mounting of two shafts 701, 810 alternative to FIG. 16.

What is claimed is:

1. A chip-card reader comprising:

a frame in which contact elements are provided, said contact elements being arranged to contact chip-card contacts carried by a chip-card, said chip-card being insertable into the chip-card reader by pushing the chip-card along a linear insertion path to a reading position in which the chip-card contacts engage the contact elements; and a contact force take-up element that remains at a predetermined position relative to the chip-card insertion path so as to take up a contact force by supporting the chip-card during insertion to the reading position, wherein the contact force take-up element extends across a linear portion of the chip-card and engages only said linear portion of the chip-card on a side of said chip-card opposite to the side of the chip-card carrying said chip-card contacts, wherein the contact force take-up element is forced by an elongated component, and wherein the elongated component is a rod, a bar, a shaft, or a pin.

2. A chip-card reader in accordance with claim 1, wherein the linear engagement between the contact force take-up element and the chip-card provides a sole means of support for the chip-card.

3. A chip-card reader in accordance with claim 1, wherein the contact force take-up element is formed by an elongated component.

4. A chip-card reader according to claim 1, wherein said contact elements are mounted on a contact support and arranged to move from a position away from the card insertion path to a reading position at which the contact elements engage the chip-card contacts in response to insertion of the chip-card to the reading position.

5. A chip-card reader in accordance with claim 1, wherein several spaced apart, elongated components form the contact force take-up element.

6. A chip-card reader in accordance with claim 3, wherein the elongated contact force take-up element mounted on the frame.

7. A chip-card reader in accordance with claim 3, wherein the elongated contact force take-up element is located on the apparatus that uses the chip-card reader.

8. A chip-card reader in accordance with claim 3, wherein the elongated contact force take-up element extends transversely to the insertion direction of the card.

9. A chip-card reader according to claim 3, wherein the elongated contact force take-up element is a round bolt located between the reading contacts and an insertion opening of the chip-card reader.

10. A chip-card reader in accordance with claim 1, wherein an elastomer material is applied to the elongated contact force take-up element.

11. A chip-card reader in accordance with claim 1, wherein a gap between the underside of the frame and the contact force take-up element is provided such that the chip-card is securely held in the reading position.

12. A chip-card reader according to claim 1, wherein a force induced by the contact force take-up element on the card is sufficient to fixedly hold the card in the reading position without abrasion.

13. A chip-card reader comprising:

a frame in which contact elements are provided said contact elements being arranged to contact chip-card contacts carried by a chip-card said chip-card being insertable into the chip-card reader by pushing the chip-card along a linear insertion path to a reading position in which the chip-card contacts engage the contact elements; and a contact force take-up element that remains at a predetermined position relative to the chip-card insertion path so as to take up a contact force by supporting the chip-card during insertion to the reading position, wherein the contact force take-up element extends across a linear portion of the chip-card and engages only said linear portion of the chip-card on a side of said chip-card opposite to the side of the chip-card carrying said chip-card contacts, wherein the contact force take-up element is forced by an elongated component, and wherein the elongated contact force take-up element is rotatably mounted at its two ends.

14. A chip-card comprising:

a frame in which contact elements are provided, said contact elements being arranged to contact chip-card contacts carried by a chip-card, said chip-card being insertable into the chip-card reader by pushing the chip-card along a linear insertion path to a reading position in which the chip-card contacts engage the contacts elements; and a contact force take-up element that remains at a predetermined position relative to the chip-card insertion path so as to take up a contact force by supporting the chip-card during insertion to the reading position, wherein the contact force take-up element extends across a linear portion of the chip-card and engages only said linear portion of the chip-card on a side of said chip-card opposite to the side of the chip-card carrying said chip-card contacts, wherein the contact force take-up element is forced by an elongated component, and wherein the elongated contact force take-up element is a round bolt located in the area of the reading contacts and further comprising an elastomer roller which is rotatably mounted on said round bolt.

15. A chip-card reader comprising:

a frame in which contact elements are provided, said contact elements being arranged to contact chip-card contacts carried by a chip-card, said chip-card being insertable into the chip-card reader to a reading position in which the chip-card contacts engage the contact elements provided in the frame; and a contact force take-up element arranged to take up force exerted by said contacts on said chip-card by supporting the chip-card during insertion to said reading position, the contact force take-up element extending across a linear portion of the chip-card and engaging said linear portion of the chip-card on a side of said chip-card opposite to the side of the chip-card carrying said chip-card contacts, wherein the contact force take-up element is formed by an elongated component and the elongated component is a rod, a bar, a shaft, or a pin.

16. A chip-card reader comprising:

a frame in which contact elements are provided, said contact elements being arranged to contact chip-card contacts carried by a chip-card, said chip-card being insertable into the chip-card reader to a reading position in which the chip-card contacts engage the contact elements provided in the frame; and a contact force take-up element arranged to take up a contact force by supporting the chip-card during insertion to said reading position, the contact force take-up element extending across a linear portion of the chip-card and engaging said linear portion of the chip-card on a side of said chip-card opposite to the side of the chip-card carrying said chip-card contacts, wherein the contact force take-up element is formed by an elongated component rotatably mounted at its two ends.

* * * * *